United States Patent
Wachi et al.

(10) Patent No.: US 7,462,973 B2
(45) Date of Patent: Dec. 9, 2008

(54) SURFACE ACOUSTIC WAVE DEVICE

(75) Inventors: Hirotada Wachi, Yokohama (JP);
Toshifumi Tanaka, Otawara (JP); Tohru Takezaki, Yokohama (JP); Satoshi Ichikawa, Otawara (JP); Tsuyoshi Oura, Kawasaki (JP); Koichi Wada, Yokohama (JP); Satoshi Orito, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/954,662

(22) Filed: Oct. 1, 2004

(65) Prior Publication Data

US 2005/0093395 A1    May 5, 2005

(30) Foreign Application Priority Data

Oct. 1, 2003    (JP)    ............... 2003-343856

(51) Int. Cl.
*H01L 41/047*    (2006.01)
(52) U.S. Cl.    ............... 310/313 B; 310/313 R
(58) Field of Classification Search    ......... 310/313 D, 310/313 B, 313 A, 313 C, 313 R
See application file for complete search history.

(56) References Cited

U.S. PATENT DOCUMENTS

| 4,642,507 | A | * | 2/1987 | Suthers et al. | 310/313 B |
| 4,973,875 | A | * | 11/1990 | Yatsuda | 310/313 D |
| 6,023,122 | A | * | 2/2000 | Liu et al. | 310/313 B |
| 6,057,630 | A | * | 5/2000 | Yanagihara et al. | 310/313 B |
| 6,380,828 | B1 | * | 4/2002 | Liu et al. | 333/193 |
| 6,577,209 | B2 | * | 6/2003 | Kobayashi et al. | 333/193 |
| 6,707,352 | B2 | * | 3/2004 | Kawaguchi | 333/193 |
| 6,856,214 | B2 | * | 2/2005 | Jian et al. | 333/154 |

FOREIGN PATENT DOCUMENTS

| JP | 57-25714 | 2/1982 |
| JP | 58-43608 | 3/1983 |
| JP | 58-191513 | 11/1983 |
| JP | 59-125113 | 7/1984 |
| JP | 10-41778 | 2/1998 |

* cited by examiner

*Primary Examiner*—Darren Schuberg
*Assistant Examiner*—Derek J Rosenau
(74) *Attorney, Agent, or Firm*—Arent Fox LLP

(57) ABSTRACT

A surface acoustic wave device includes a piezoelectric substrate, at least one interdigital transducer (IDT) provided on the piezoelectric substrate, and a shield electrode provided on the piezoelectric substrate. The IDT has a first pattern on an edge that faces the shield electrode. The shield electrode has a second pattern on an edge so as to be evenly spaced apart from the first pattern.

17 Claims, 15 Drawing Sheets

FIG. 4A

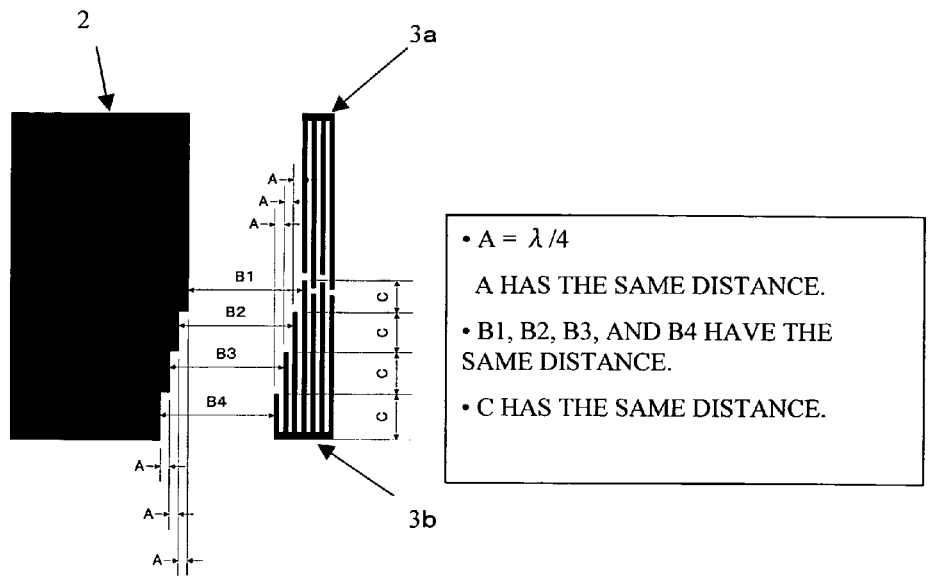

- $A = \lambda/4$
  A HAS THE SAME DISTANCE.
- B1, B2, B3, AND B4 HAVE THE SAME DISTANCE.
- C HAS THE SAME DISTANCE.

FIG. 4B

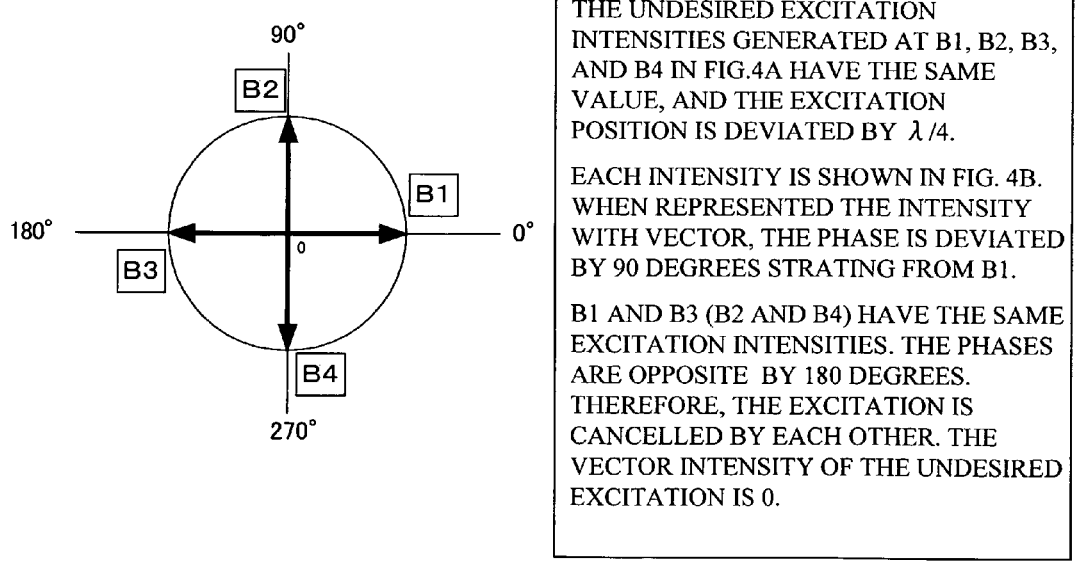

THE UNDESIRED EXCITATION INTENSITIES GENERATED AT B1, B2, B3, AND B4 IN FIG.4A HAVE THE SAME VALUE, AND THE EXCITATION POSITION IS DEVIATED BY $\lambda/4$.

EACH INTENSITY IS SHOWN IN FIG. 4B. WHEN REPRESENTED THE INTENSITY WITH VECTOR, THE PHASE IS DEVIATED BY 90 DEGREES STRATING FROM B1.

B1 AND B3 (B2 AND B4) HAVE THE SAME EXCITATION INTENSITIES. THE PHASES ARE OPPOSITE BY 180 DEGREES. THEREFORE, THE EXCITATION IS CANCELLED BY EACH OTHER. THE VECTOR INTENSITY OF THE UNDESIRED EXCITATION IS 0.

FREQUENCY CHARACTERISTIC

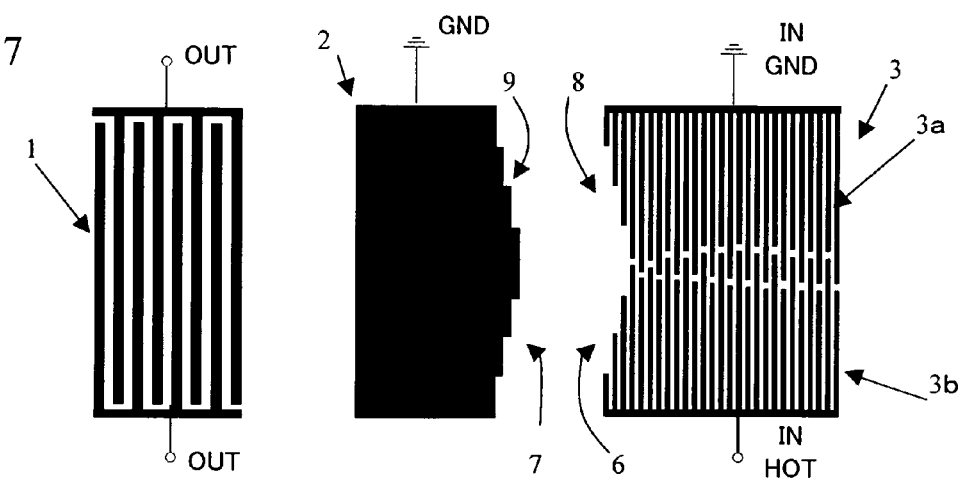
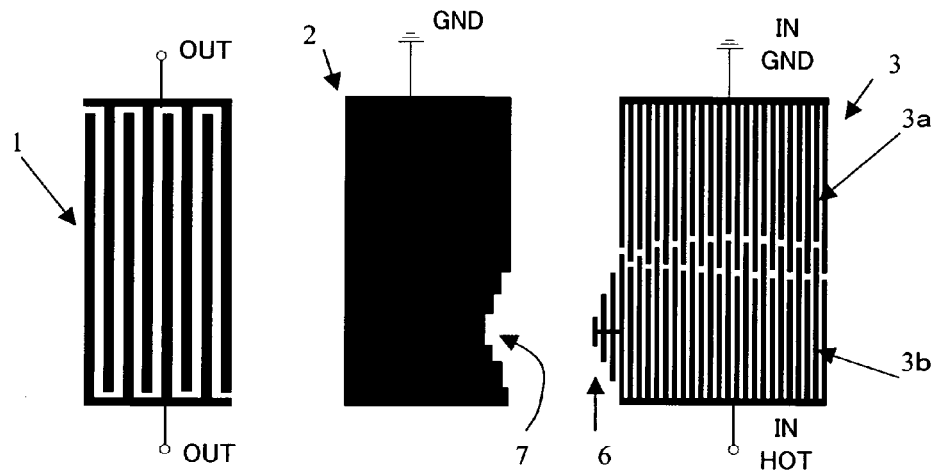
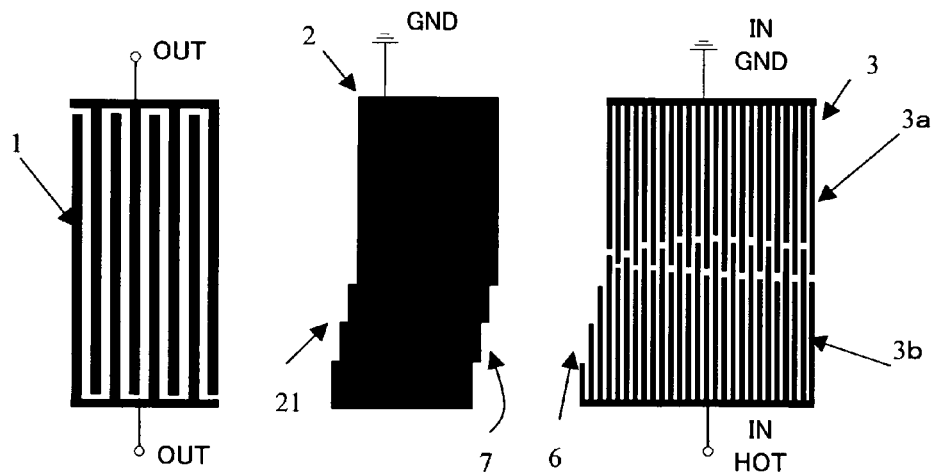
FIG. 7
FIG. 8
FIG. 9

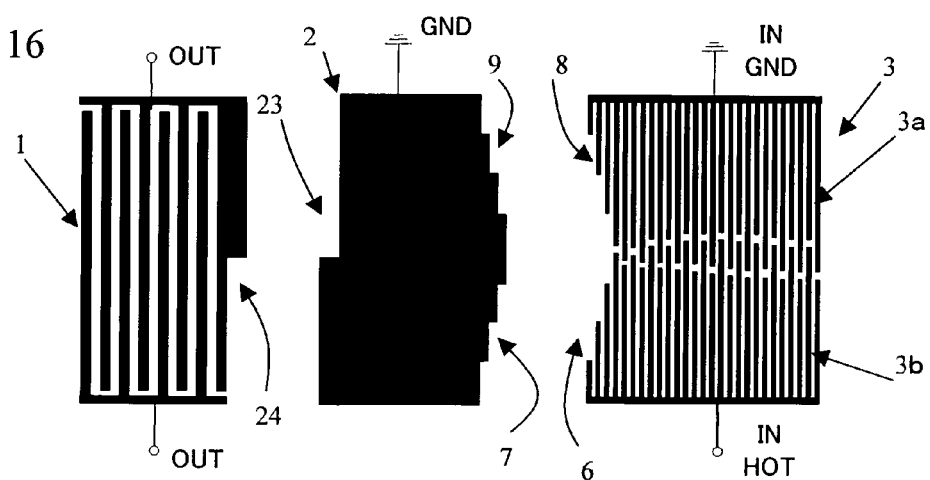
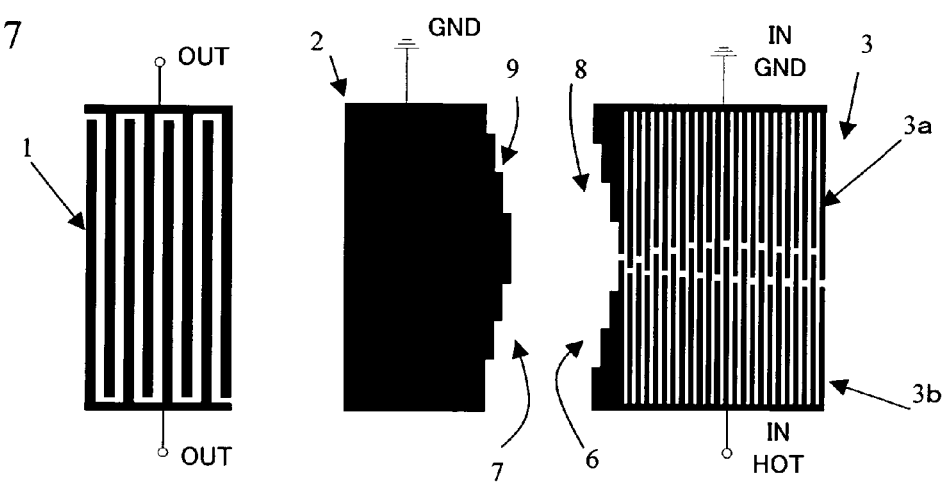
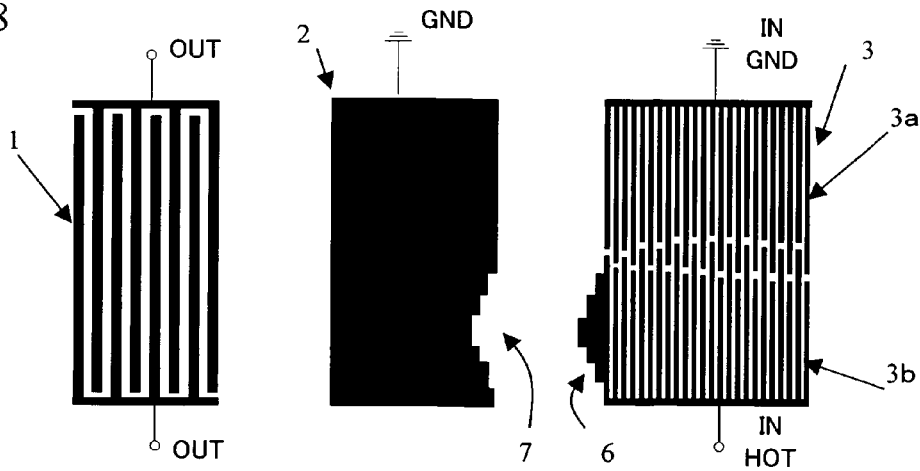

SURFACE ACOUSTIC WAVE DEVICE

BACKGROUND OF THE INVENTION

1. Field of the Invention

This invention generally relates to a surface acoustic wave device, and more particularly, to a surface acoustic wave device having a shield electrode and at least one interdigital transducer (hereinafter referred to as IDT) on a piezoelectric material substrate (hereinafter referred to as piezoelectric substrate).

2. Description of the Related Art

In these years, the above-mentioned type of surface acoustic wave (hereinafter referred to as SAW) has been employed for a bandpass filter in a television set having a frequency range of 30 MHz to 400 MHz and an RF filter in a mobile telephone having a frequency range of 800 MHz to several GHz. An IDT includes a pair of comb-like electrodes. Each comb-like electrode is composed of a bus bar and electrode fingers having first edges connected to the bus bar and second edges that are open. A pair of comb-like electrodes is arranged so that the electrode fingers of the comb-like electrodes are alternately crossed or interleaved at regular intervals. In other words, the interleaved electrode fingers are alternately connected two bus bars. A SAW is generated by applying an alternating voltage across the pair of comb-like electrodes. The SAW has a frequency response by which a filter having a desired frequency characteristic is obtainable.

FIGS. 1A and 1B show a conventional SAW device. FIG. 1A shows an overall schematic diagram of the conventional SAW device, and FIG. 1B shows an enlarged view of a shield electrode shown in FIG. 1A. The SAW device shown in FIGS. 1A and 1B includes a first IDT 10 that is arranged on a piezoelectric substrate 50, a shield electrode 20, and a second IDT 30. The first IDT 10, the shield electrode 20, and the second IDT 30 are adjacently arranged in the direction of SAW propagation. The shield electrode 20 is arranged between the first IDT 10 and the second IDT 30. For instance, the first IDT 10 serves as an input electrode, and the second IDT 30 serves as an output electrode. The shield electrode 20 prevents electromagnetic coupling of the first IDT 10 and the second IDT 30.

The IDT 30 includes a pair of comb-like electrodes 30a and 30b. The comb-like electrode 30a includes a bas bar and multiple electrode fingers. The comb-like electrode 30b also includes a bas bar and multiple electrode fingers. The open edges of the electrode fingers 30a face those of the electrode fingers 30b. The crossing portions of the interleaved electrode fingers that face each other are involved in excitation of SAW. As shown in FIG. 1B, an electrode finger pattern is weighted. The electrode finger pattern is defined as a pattern formed by the electrode fingers. The electrode finger pattern may by weighted by, for example, apodization. The weighting of the electrode finger pattern may alter the frequency characteristic.

The IDT 10 also includes a pair of comb-like electrodes; however, the IDT 10 is not weighted, which is different from the IDT 30. In other words, the electrode fingers of the IDT 10 have an equal crossing width.

The above-mentioned filter functions as a bandpass filter. This type of bandpass filter has a problem in that undesired waves are generated from the electrode finger edges of the IDT 30. The undesired waves degrade the frequency characteristic.

In order to remove the undesired waves, antireflection electrodes 40 are arranged on one side of the IDT 30 adjacent to the shield electrode 20, as shown in FIG. 1B. The antireflection electrodes 40 include multiple electrode fingers. The multiple electrode fingers are configured so that the undesired waves are generated so as to be equal in amplitude but opposite in phase. Thus, the undesired waves can be cancelled by each other. The above-mentioned conventional technique is disclosed in, for example, Japanese Laid-Open Patent Application Publication No. 57-25714 (hereinafter referred to as Document 1) or Japanese Laid-Open Patent Application Publication No. 59-125113 (hereinafter referred to as Document 2).

Japanese Laid-Open Patent Application Publication No. 10-41778 (hereinafter referred to as Document 3) discloses a technique to remove the undesired waves propagating inside the piezoelectric substrate. The publication shows the use of a dummy electrode arranged on one side of the IDT 30.

Further, Japanese Laid-Open Patent Application Publication No. 58-43608 (hereinafter referred to as Document 4) shows that the crossing portions of the IDT 30 has a tilt in arrangement, as shown in FIG. 2. The tilt arrangement prevents undesired bulk waves from being generated.

However, the techniques disclosed in Documents 1, 2, and 4 are intended to remove the undesired waves generated between the input IDT and a stem in the direction of the thickness of the piezoelectric substrate, or to remove the undesired waves generated solely at one side of the input IDT. Even if the above-mentioned undesired waves are removed, there is another problem in that a satisfactorily high attenuation in the stopband cannot be achieved. Besides, the technique disclosed in Documents 3 cannot remove the undesired excitation completely, since minute crossing portions exist on the side of the IDT 30. Thus, the undesired excitation cannot be removed completely, so that the signals cannot be sufficiently attenuated in the stopband.

SUMMARY OF THE INVENTION

This invention has been made in view of the above circumstances and provides an SAW device that has improved the high damping property in the stopband.

According to an aspect of the present invention, there is provided a surface acoustic wave device including, a piezoelectric substrate, at least one interdigital transducer (IDT) provided on the piezoelectric substrate, and a shield electrode provided on the piezoelectric substrate, and the IDT has a first pattern on an edge that faces the shield electrode, the shield electrode has a second pattern on an edge so as to be evenly spaced apart from the first pattern.

BRIEF DESCRIPTION OF THE DRAWINGS

Preferred embodiments of the present invention will be described in detail with reference to the following figures, wherein:

FIGS. 4A and 4B illustrate the principle of the present invention;

FIG. 7 shows a SAW device in accordance with a second embodiment;

FIG. 8 shows a SAW device in accordance with a third embodiment;

FIG. 9 shows a SAW device in accordance with a fourth embodiment;

FIG. 16 shows a SAW device in accordance with an eleventh embodiment;

FIG. 17 shows a SAW device in accordance with a twelfth embodiment;

FIG. 18 shows a SAW device in accordance with a thirteenth embodiment;

DESCRIPTION OF THE PREFERRED EMBODIMENTS

A description will now be given, with reference to the accompanying drawings, of embodiments of the present invention.

The inventors studied the reason why the conventional SAW filter cannot sufficiently attenuate the frequency components in the stopband completely. The inventors presumed that undesired excitation may be generated between the edge of the IDT 30 that faces the shield electrode 20 and the edge of the shield electrode 20 that faces the IDT 30. Then, the inventors came up with the following mechanisms of removing the undesired excitation.

Figure 1A:
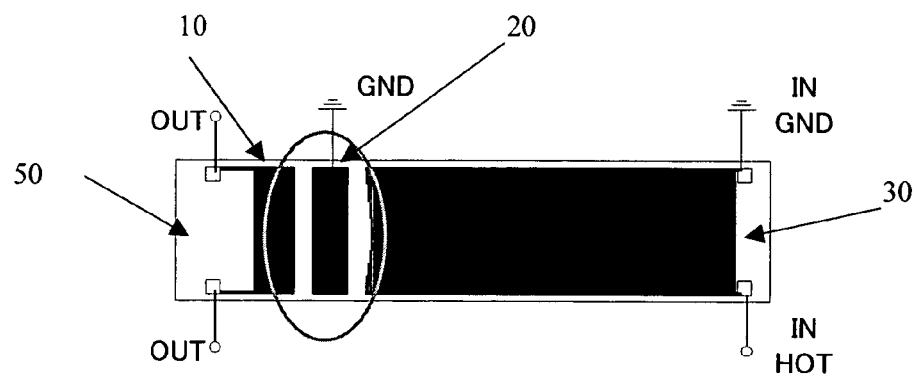
FIGS. 1A and 1B show a conventional SAW device.
Figure 1B:
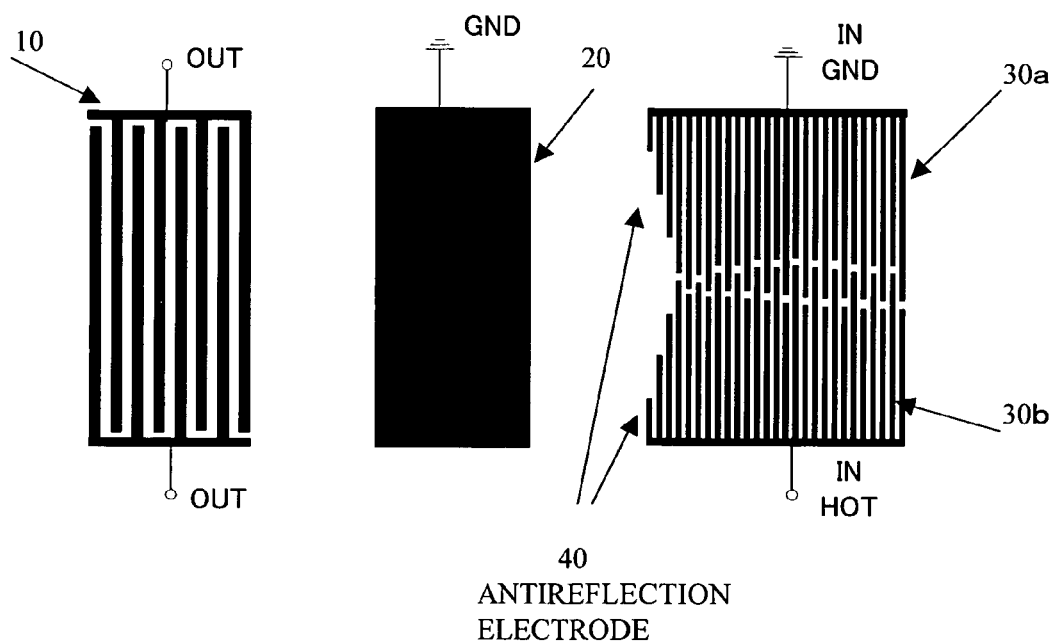
Figure 2:
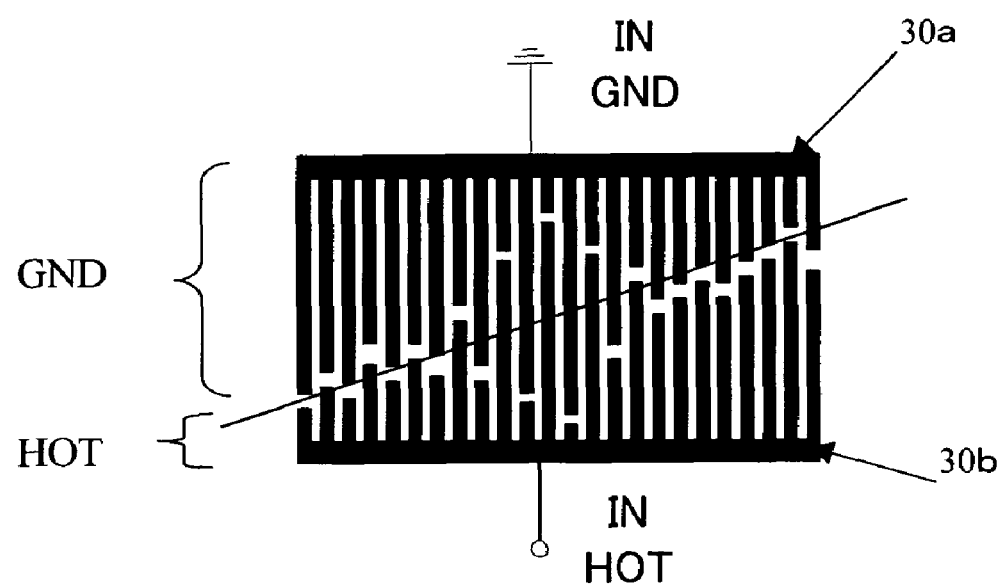
FIG. 2 shows a substantial part of another conventional SAW device.
Figure 3A:
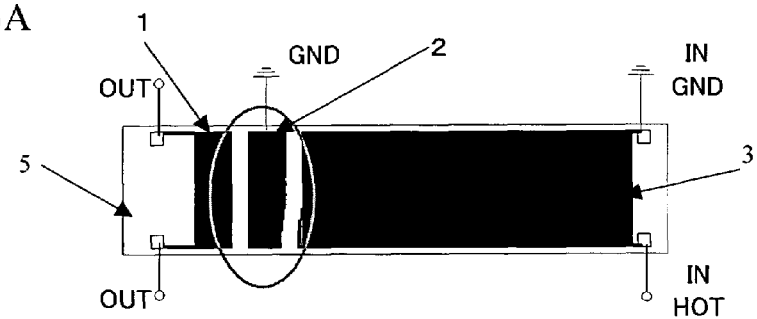
FIGS. 3A through 3C illustrate the principle of the present invention.
Figure 3B:
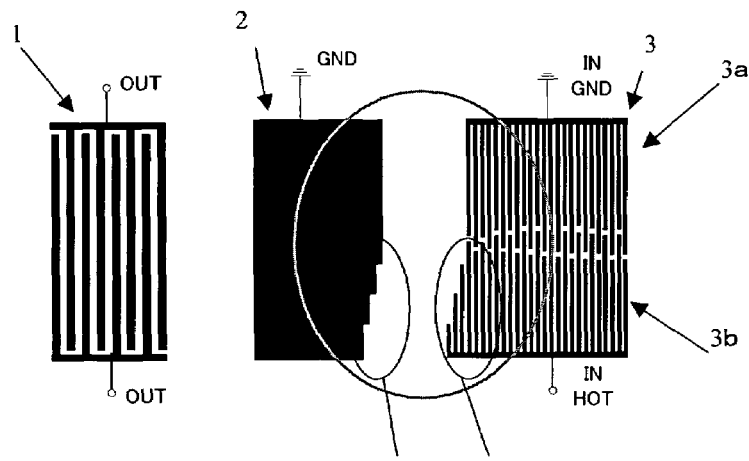
Figure 3C:
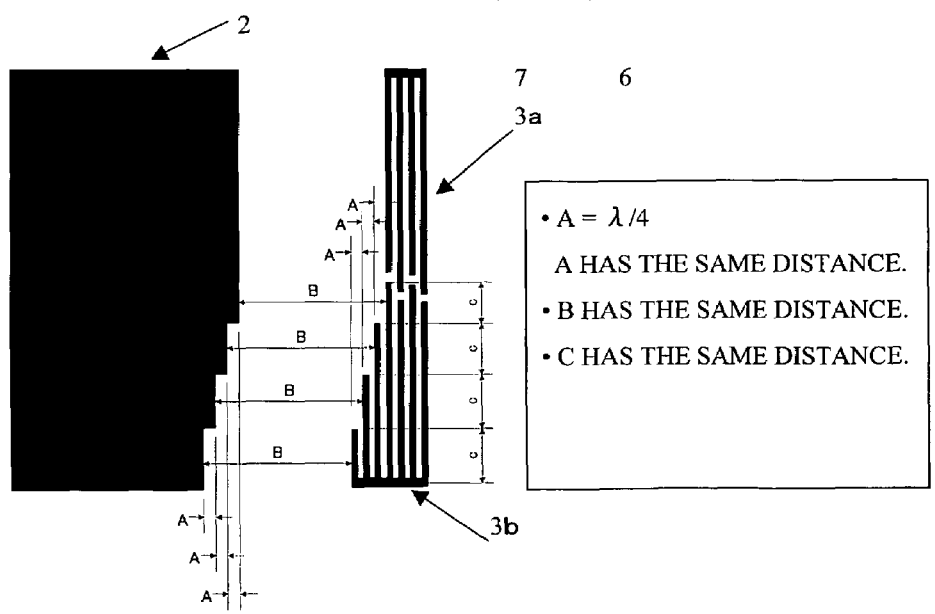

FIGS. 3A through 3C show the principle of the present invention. More particularly, FIG. 3A shows an example of the overall structure of the SAW device. FIG. 3B shows an enlarged view of a shield electrode shown in FIG. 3A. FIG. 3C shows a further enlarged view of the shield electrode. As shown in FIG. 3A, a SAW device includes a piezoelectric substrate 5, two IDTs 1 and 3 arranged on the piezoelectric substrate 5, and a shield electrode 2. The IDT 1 is a normal electrode, and the IDT 3 includes an electrode finger pattern weighted by apodizing, for example. The IDT 3 serves as an input IDT, and the IDT 1 serves as an output IDT, for example. The IDT 3 includes a pair of comb-like electrodes, one of which electrodes is grounded and the other electrode is supplied with an alternating voltage. The comb-like electrode to which the alternating voltage is applied is referred to as a HOT-side electrode. The paired electrodes of the IDT 1 are respectively connected to pads provided on the piezoelectric substrate 5. Similarly, the paired electrodes of the IDT 3 are respectively connected to pads provided on the piezoelectric substrate 5.

Referring to FIG. 3B, a first pattern 6 is provided on one side of the IDT 3 next to the shield electrode 2. A second pattern 7 is provided on one side of the shield electrode 2 so that the edges of the electrode finger of the first pattern 7 are evenly spaced apart from those of the second pattern 6. In addition, the first pattern 6 and the second pattern 7 are arranged so that the total vector intensity of the undesired excitation generated between the shield electrode 2 and the IDT 3 is zero. In FIG. 3B, both of the first pattern 6 and the second pattern 7 have steps. Therefore, it can be said that the IDT 3 includes a first step pattern 6 and the shield electrode 2 includes a second step pattern 7. The steps of the first pattern 6 are defined by multiple electrode fingers in a HOT-side electrode 3b. The steps of the second pattern 7 are defined by patterning a solid electrode into the shield electrode 2 that has the steps.

Referring to FIG. 3C, a description will now be given of the shield electrode 2 and the IDT 3 in more detail. A parameter A in FIG. 3C is the width of the steps provided in the first pattern 6 and the second pattern 7. Regarding the first pattern 6, the parameter A is the distance between the adjacent electrode fingers. The width A of the steps of the first pattern 6 is equal to the width A of the steps of the second pattern 7. The parameter A is equal to $\lambda/4$, for example where $\lambda$ is the wavelength of the SAW in the passband. A parameter B is the distance between the first pattern 6 and the second pattern 7. More particularly, the parameter B is the distance between the corresponding steps of the first and second patterns 6 and 7. All the distances between the facing steps are identical. A parameter C is the length of the steps that form the first pattern 6. The lengths C of the steps of the first pattern 6 are equal to each other. The parameter C is equal to the difference in length between the adjacent electrode fingers in the first pattern 6. With the above-mentioned configuration, 180° ($\lambda/2$)-out-of-phase excitations with an identical intensity can be generated between the IDT 3 and the shield electrode 2 and are cancelled. Thus, an undesired mode (undesired excitation) that affects the frequency characteristic in the stopband, can be removed. The SAW device thus structured has a sufficiently high attenuation characteristic.

Referring to FIGS. 4A and 4B, the principle of the above-mentioned operation will be described. FIG. 4A corresponds to FIG. 3C. In FIG. 4A, the parameter B, which is the distance between the first pattern 6 and the second pattern 7, is represented as B1, B2, B3, and B4 (B=B1=B2=B3=B4). The symbols B1 through B4 also denote vectors that represent the intensities of SAWs in the associated sections. Referring to FIG. 4B, the lengths C in the shield electrode 2 are equal to the lengths C of the steps respectively related to the sections B1, B2, B3, and B4 on the HOT side of the IDT 3. Therefore, undesired excitations caused in the sections B1, B2, B3 and B4 have an identical intensity. As mentioned above, the width A of the steps is $\lambda/4$, and the SAW excited positions are by $\lambda/4$. Starting from B1, the phase is deviated by 90 degrees. The excitation intensities B1 through B4 can be described by the vectors shown in FIG. 4B. It can be seen from FIG. 4B that the excitations in the sections B1 and B3 have an identical intensity and a phase difference of 180 degrees. Similarly, the excitations in the sections B2 and B4 have an identical intensity and a phase difference of 180 degrees. Therefore, these excitations can be cancelled totally. The total vector intensity becomes 0 between the shield electrode 2 and the HOT-side electrode of the IDT 3.

Figure 5A:
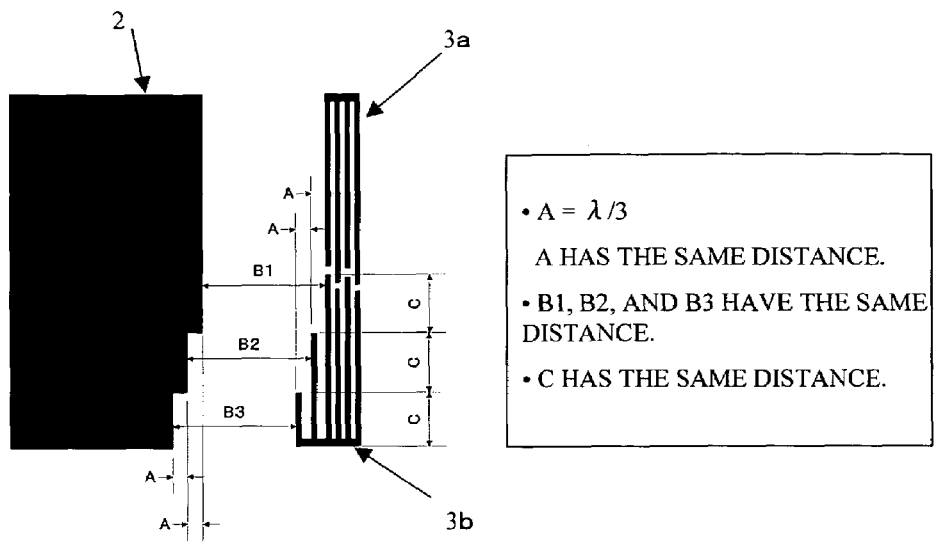
FIGS. 5A and 5B illustrate the principle of the present invention.
Figure 5B:
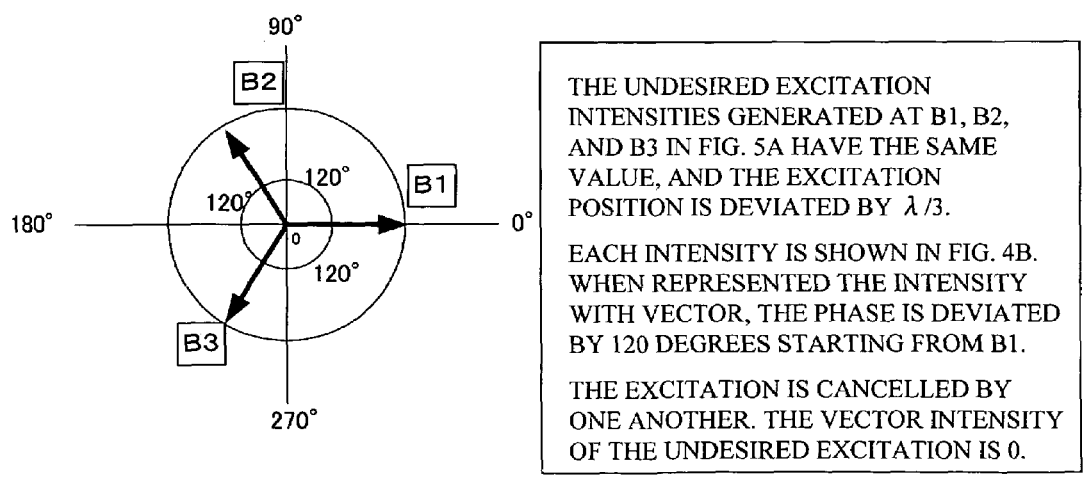

The above-mentioned mechanism can be expanded as follows. For example, as shown in FIG. 5A, three steps are arranged so that excitations with an identical intensity are generated so as to have a deviation of 120 degrees. Thus, as shown in FIG. 5B, the total vector intensity becomes 0, and similar effects to those for the arrangement shown in FIG. 4A are obtainable. The undesired excitations generated in the sections B1, B2, and B3 in FIG. 5A have an identical intensity, and are λ/3 out of phase. Starting from B1, the phase is deviated by 120 degrees, as shown in FIG. 5B. Thus, the excitations in the sections B1, B2, and B3 are cancelled, and the total vector intensity of the undesired excitations becomes 0. There is no limitation on the number of steps and the positional relationship between the facing steps as long as the total vector intensity is equal to zero. This may be described with a general expression as follows. The first pattern 6 includes steps having a width of $m\lambda+\lambda/n$ where λ is the wavelength in the passband of the SAW, m is 0 or a natural number, and n is a natural number. The distance between the edge of the shield electrode 2 and that of the IDT 3 is equal to $m\lambda+\lambda/n$ where λ is the wavelength in the passband of the SAW, m is 0 or a natural number, and n is a natural number. The parameters m used in the two expressions are not required to be equal.

Figure 6A:
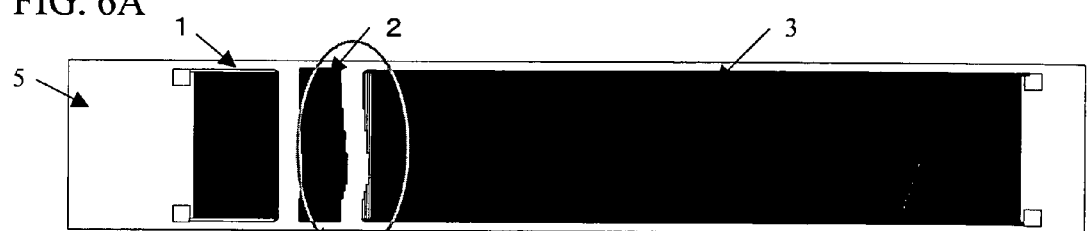
FIG. 6A through 6E show a SAW device in accordance with a first embodiment and a comparative example, together with time-base response and frequency characteristic of the first embodiment and the comparative example.
Figure 6B:
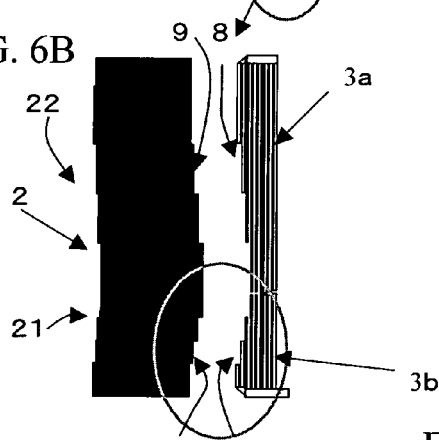
Figure 6C:
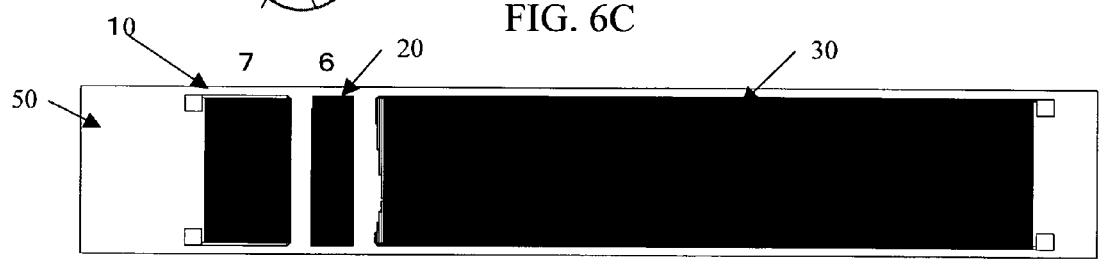

A description will now be given of a first embodiment of the present invention. FIG. 6A is a plan view of a SAW device in accordance with the first embodiment, and FIG. 6B is an enlarged view of a shield electrode employed in the SAW device shown in FIG. 6A. Hereinafter, the same components and configurations as those of FIG. 5 are given the same reference numerals. As shown in FIG. 6B, a HOT-side electrode 3b of the IDT 3 includes a first step pattern 6 having four steps. Each of the four steps has a width of λ/4. Correspondingly, the shield electrode 2 includes a second step pattern 7 having four steps each having a width of λ/4. Therefore, the distances between the corresponding steps are identical. In the first embodiment, a ground-side electrode 3a in the IDT 3 includes a step pattern 8 having four steps. The shield electrode 2 includes a step pattern 9 having four steps. The four steps of the step pattern 8 are evenly spaced apart from those of the step pattern 9. In addition, the shield electrode 2 has a step pattern 21 and a step pattern 22. The step pattern 21 corresponds to the step pattern 7, and the step pattern 22 corresponds to the step pattern 9. The step pattern 21 and the step pattern 22 are adjacent to the IDT 1. The step patterns 21 and 22 are arranged with a constant ratio of the shield electrode 2 to a piezoelectric substrate 5 having no shield electrode 2 thereon, in the propagation direction of the SAW. In other words, the width of the electrode 2 is not constant. For example, the shield electrode 2 may be comparatively wide for a comparatively long distance between the IDT1 and the IDT3. In contrast, the shield electrode 2 may be comparatively narrow for a comparatively short distance between the IDT1 and the IDT3. Thus, The SAW launched from the IDT 3 comes under the influence of the shield electrode 2 and the piezoelectric substrate 5 having no shield electrode 2 thereon at the same rate, even if the SAW travels any area of the shield electrode 2. Thus, the SAW velocity can be kept constant. The ratio of the length of the exposed surface area of the piezoelectric substrate 5 (more strictly, composed of the surface area between the IDT 3 and the shield electrode 2 and that between the shield electrode 2 and the IDT 1) to the length of the shield electrode 2 is constant on any imaginary line connecting the edges of the IDTs 1 and 3 in the propagation direction. FIG. 6C shows a comparative example. The shield electrode 20 has a rectangular shape and has no step pattern. The IDT 30 includes the step patterns 6 and 8 as in the IDT 3.

Figure 6D:
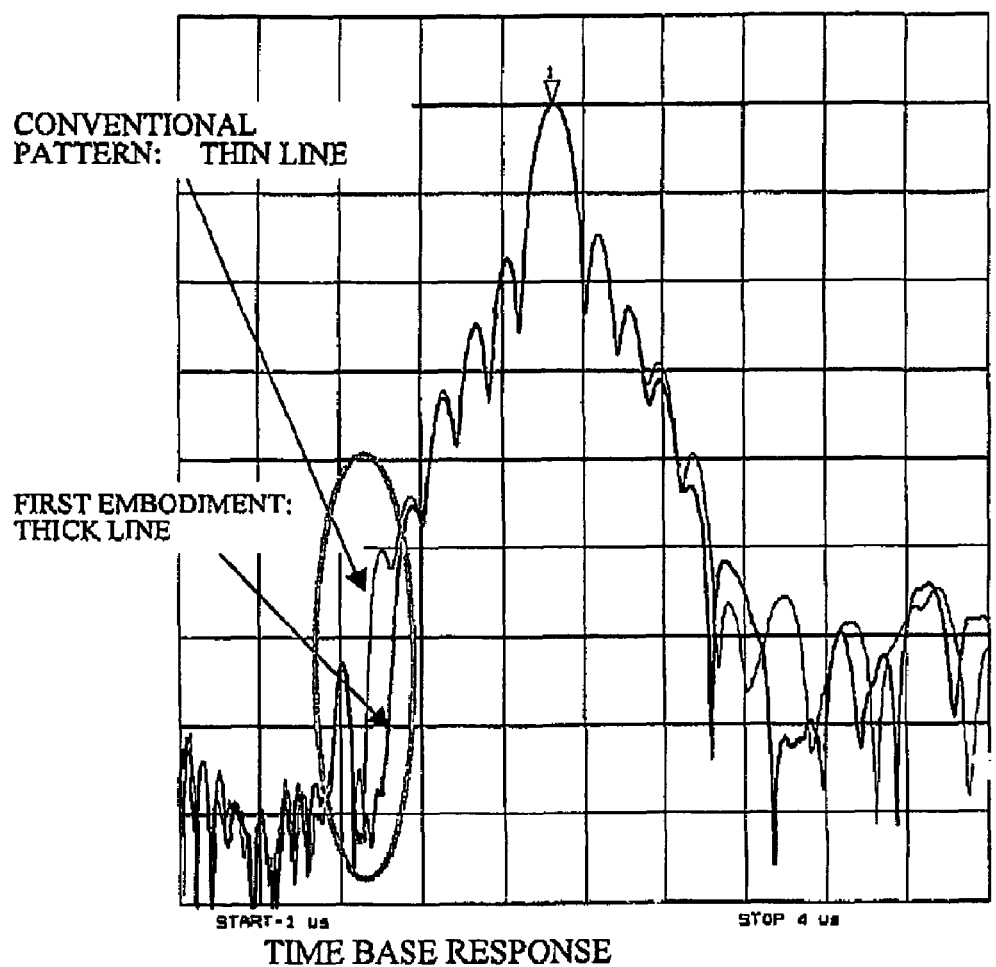
Figure 6E:
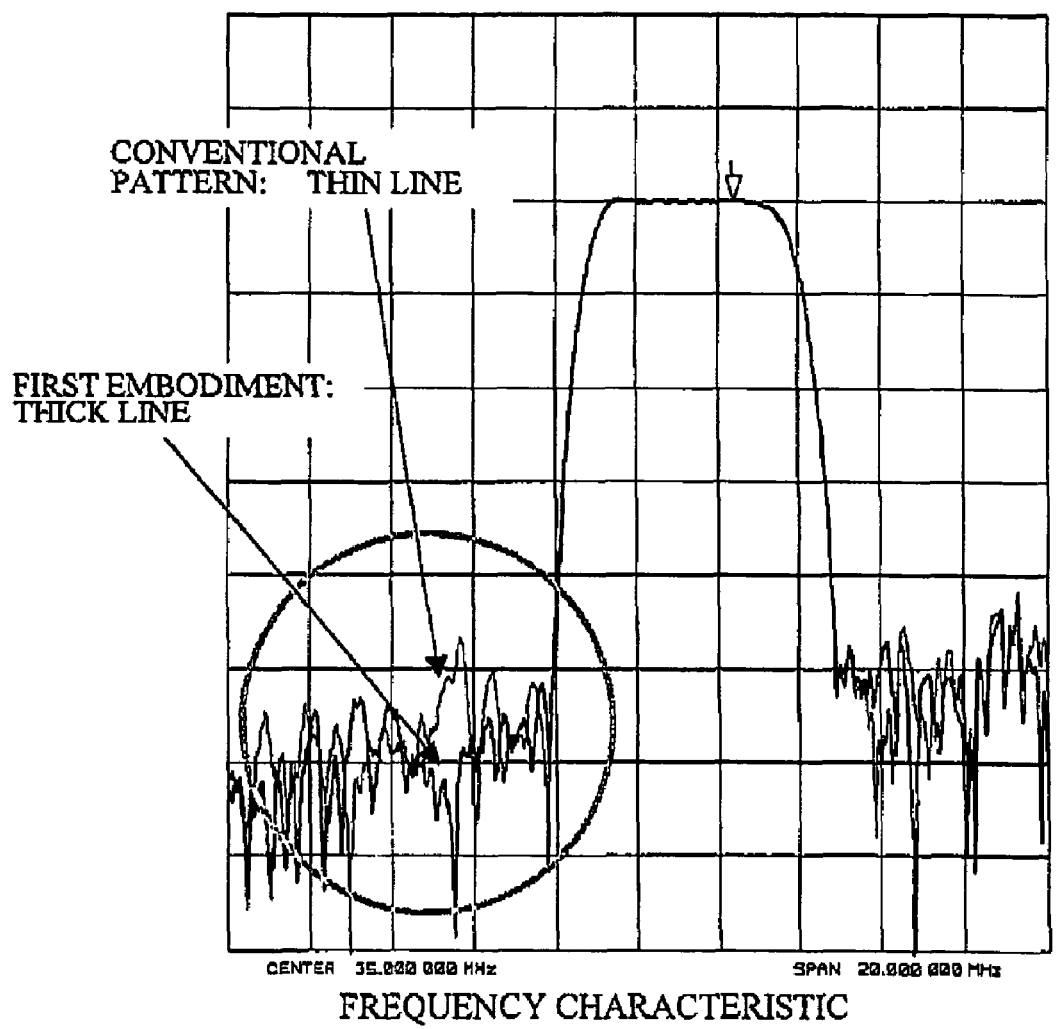

FIG. 6D is a graph describing time-domain responses of the first embodiment and the comparative example. The horizontal line shows time, and the vertical line shows intensity (attenuation). FIG. 6E shows a frequency characteristic that is converted from FIG. 6D on the frequency basis. The horizontal line shows frequency, and the vertical line shows intensity (attenuation). The first embodiment is much improved as compared to the comparative example, particularly, in the stopband characteristic in circles in FIGS. 6D and 6E. This results from removal of the undesired mode between the shield electrode 2 and the HOT side electrode 3b of the IDT3.

The piezoelectric substrate may be made of, for example, 128° $LiNbO_3$, 112° $LiTaO_3$, $Li_2B_4O_7$, quartz, 36° $LiTaO_3$, 42° $LiTaO_3$, 64° $LiNbO_3$.

FIG. 7 shows a SAW device in accordance with a second embodiment. The IDT 3 includes the step patterns 6 and 8 respectively provided on the HOT-side electrode 3b and the ground electrode 3. Each of the step patterns 6 and 8 is defined by respective four electrode fingers. One side of the electrode 2 facing the IDT 3 includes step patterns 7 and 9. The step pattern 7 corresponds to the step pattern 6 on the HOT-side electrode 3b. The step pattern 9 corresponds to the step pattern 8 on the ground electrode 3a. The four steps of the step pattern 6 are evenly spaced apart from those of the step pattern 7. Similarly, the four steps of the step pattern 8 are evenly spaced apart from those of the step pattern 9. The other side of the electrode 2 next to the IDT 1 has a linear shape. With the above-mentioned configuration, it is possible to remove the undesired mode generated between the shield electrode 2 and the HOT-side electrode 3b of the IDT3. This improves the degree of suppression in the stopband.

FIG. 8 shows a SAW device in accordance with a third embodiment. The step pattern 6 on the HOT-side electrode 3b is a mountain-like shape having four steps. A connecting path is arranged around the center of the step pattern 6 so as to electrically connect the electrode fingers. Each electrode finger has a facing or exposed portion having a width of λ/4. The shield electrode 2 has a shape that corresponds to the step pattern 6. The steps of the step pattern 6 are evenly spaced apart from those of the step pattern 7. With the above-mentioned configuration, it is possible to remove the undesired mode generated between the shield electrode 2 and the HOT side electrode 3b of the IDT3. The degree of suppression in the stopband can be improved.

FIG. 9 shows a SAW device in accordance with a fourth embodiment. The step pattern 6 has four electrode fingers arranged on the HOT-side electrode 3b of the IDT 3, as shown in FIG. 9. The shield electrode 2 has the step pattern 7 that faces the step pattern 6 of the IDT 3. In order to keep a propagation velocity of the SAW constant, a step pattern 21 is arranged on the side of the shield electrode 2 adjacent to the IDT 1. With the above-mentioned configuration, it is possible to remove the undesired mode generated between the shield electrode 2 and the HOT-side electrode 3b of the IDT3. In addition, the propagation velocity of the SAW can be kept constant wherever the SAW may be propagated.

Figure 10:
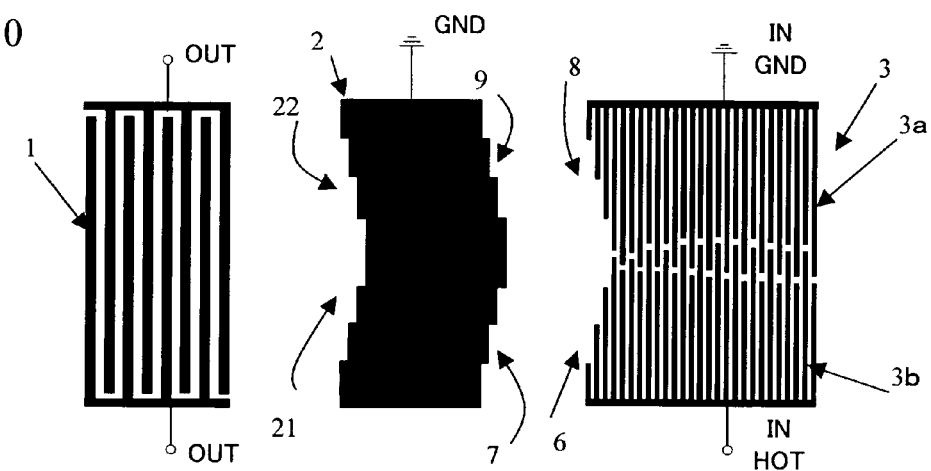
FIG. 10 shows a SAW device in accordance with a fifth embodiment.

FIG. 10 shows a SAW device in accordance with a fifth embodiment. The step pattern 6 having four electrode fingers is arranged on the HOT-side electrode 3b of the IDT 3. Similarly, the step pattern 8 having four electrode fingers as shown in FIG. 4 is arranged on the ground-side electrode 3a of the IDT 3. The step pattern 7 is arranged on one side of the shield electrode 2 facing the IDT 3. The step pattern 7 corresponds to the step pattern 6 of the HOT-side of the IDT 3. The step pattern 9 is arranged on one side of the shield electrode 2 facing the IDT 3. The step pattern 8 corresponds to the step pattern 9 of the ground-side of the IDT 3. The steps of the step pattern 6 are evenly spaced apart from those of the step pattern 7. The steps of the step pattern 8 are evenly spaced apart from those of the step pattern 9. The step patterns 21 and 22 are arranged on the other side of the shield electrode 2 next to IDT 1 so that the propagation velocity is kept constant wherever the SAW may be propagated. The distances between the respectively corresponding steps of the step patterns 7 and 21 are not identical. However, in an area between the IDT 1 and the IDT3, a ratio of the surface area occupied by the shield electrode 2 to the unoccupied surface area is constant. Further, the distances between the respectively corresponding steps of the steps 9 and 22 are not the same. However, in an area between the IDT 1 and the IDT3, the ratio of the area occupied by the shield electrode 2 and the unoccupied area is constant. With the above-mentioned configuration, it is possible to remove the undesired mode generated between the shield electrode 2 and the HOT-side electrode 3b of the IDT3. In addition, the propagation velocity of the SAW can be kept constant wherever the SAW may be propagated.

Figure 11:
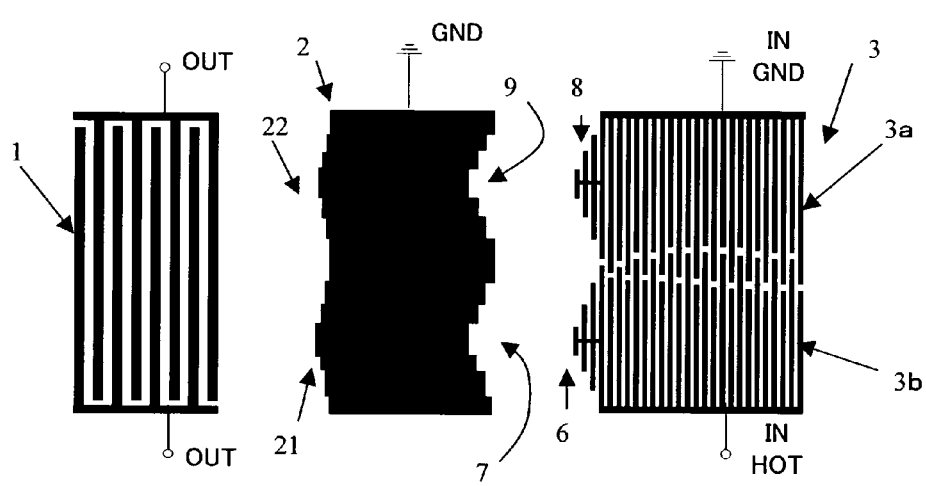
FIG. 11 shows a SAW device in accordance with a sixth embodiment.

FIG. 11 shows a SAW device in accordance with a sixth embodiment. The IDT 3 includes two sets of mountain-like step patterns 6 and 8. The HOT-side electrode 3b has the step pattern 6 and the ground-side electrode 3a has the step pattern 8. The step patterns 7 and 9 are arranged on one side of the shield electrode 2 adjacent to the IDT 3. The steps of the step pattern 6 are evenly spaced apart from those of the step pattern 7. The steps of the step pattern 8 are evenly spaced apart from those of the step pattern 9. The step patterns 21 and 22 are arranged on the other side of the shield electrode 2 next to the IDT 1 so that the propagation velocity is kept constant wherever the SAW may be propagated. The steps of the step pattern 7 are not evenly spaced apart from those of the step pattern 21. However, in an area between the IDT 1 and the IDT3, the ratio of the surface area occupied by the shield electrode 2 to the unoccupied surface area is constant. Further, the steps of the step pattern 9 are not evenly spaced apart from those of the step pattern 22. However, in an area between the IDT 1 and the IDT3, the ratio of the surface area occupied by the shield electrode 2 to the unoccupied surface area is constant. With the above-mentioned configuration, it is possible to remove the undesired mode generated between the shield electrode 2 and the HOT-side electrode 3b of the IDT3. In addition, the propagation velocity of the SAW can be kept constant wherever the SAW may be propagated.

Figure 12:
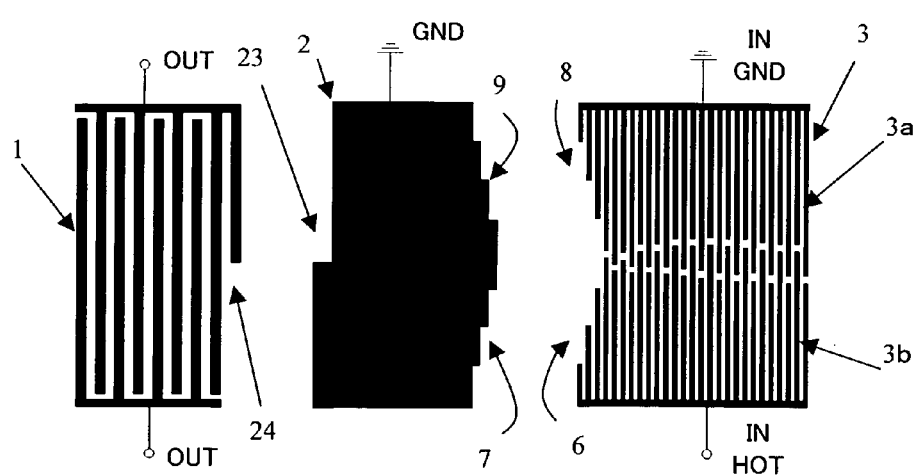
FIG. 12 shows a SAW device in accordance with a seventh embodiment.

FIG. 12 shows a SAW device in accordance with a seventh embodiment. In the seventh embodiment, one side of the shield electrode 2 is arranged in the same fashion as shown in FIG. 10, however, a step pattern 23 having only one step is arranged on another side of the shield electrode 2 next to the IDT 1. A step pattern 24 is arranged on the IDT 1 so as to correspond to the step pattern 23. With the above-mentioned configuration, it is possible to remove the undesired mode generated between the shield electrode 2 and the HOT-side electrode 3b of the IDT 3. It is further possible to remove the undesired mode generated between the shield electrode 2 and the IDT 1. Thus, the degree of suppression in the stopband can be improved.

Figure 13:
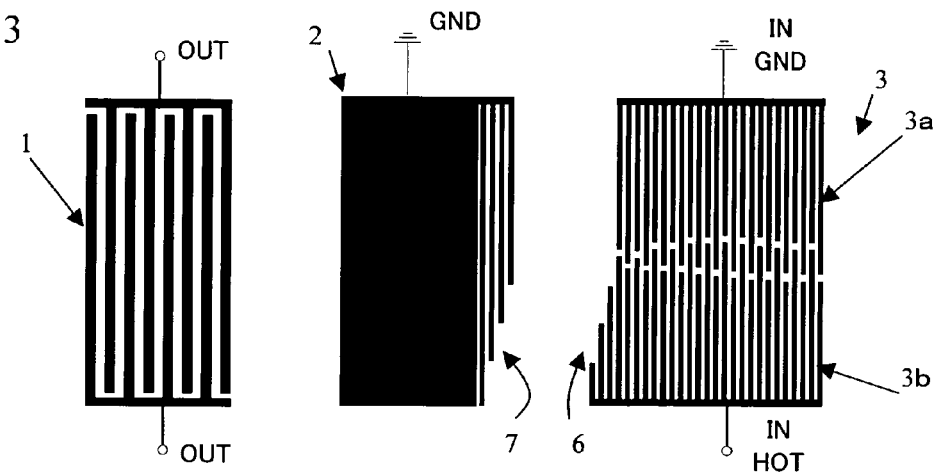
FIG. 13 shows a SAW device in accordance with an eighth embodiment.

FIG. 13 shows a SAW device in accordance with an eighth embodiment. The IDT 3 has the same configuration as that shown in FIG. 9. In the eighth embodiment, the step pattern 7 is arranged on the shield electrode 2 with the electrode fingers. The electrode fingers of the step pattern 7 are arranged in the same manner as shown in FIG. 4. That is, the steps of the step pattern 6 are evenly spaced apart from those of the step pattern 7. The vector intensity of the undesired excitation generated among the above-mentioned steps is 0 in total. With the above-mentioned configuration, it is possible to remove the undesired mode generated between the shield electrode 2 and the HOT-side electrode 3b of the IDT 3. The degree of suppression in the stopband can be improved.

Figure 14:
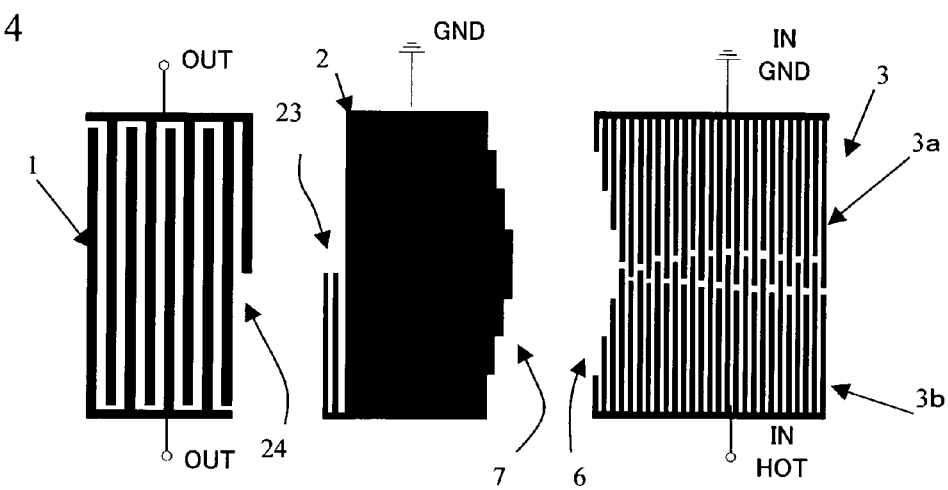
FIG. 14 shows a SAW device in accordance with a ninth embodiment.

FIG. 14 shows a SAW device in accordance with a ninth embodiment. In the ninth embodiment, the IDT 3 is arranged in the same way as shown in FIG. 7. Additionally, one side of the shield electrode 2 is arranged in the same way as shown in FIG. 7. The step pattern 23 is arranged on another side of the shield electrode 2 next to the IDT1 with the electrode fingers. The step pattern 24 is arranged on one side of the IDT 1 next to the shield electrode 2. With the above-mentioned configuration, it is possible to remove the undesired mode generated between the shield electrode 2 and the HOT-side electrode 3b of the IDT 3. It is further possible to remove the undesired mode generated between the shield electrode 2 and the IDT 1. Thus, the degree of suppression in the stopband can be improved.

Figure 15:
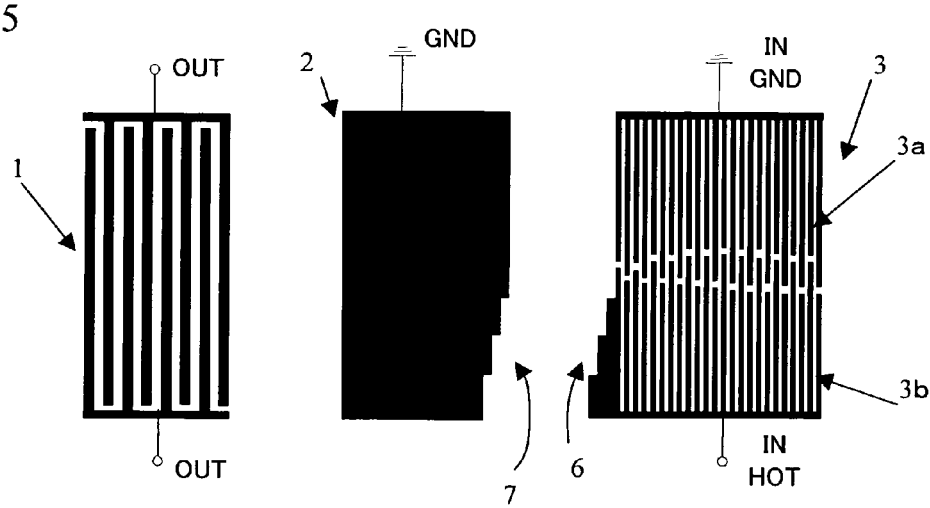
FIG. 15 shows a SAW device in accordance with a tenth embodiment.

FIG. 15 shows a SAW device in accordance with a tenth embodiment. The step pattern 6 of the IDT 3 is arranged with a solid electrode pattern. The step pattern 6 made of the solid electrode pattern meets the requirements of FIG. 4. With the above-mentioned configuration, it is possible to remove the undesired mode generated between the shield electrode 2 and the HOT-side electrode 3b of the IDT 3. The degree of suppression in the stopband can be improved.

FIG. 16 shows a SAW device in accordance with an eleventh embodiment. The shield electrode 2 and the IDT 3 have the same configurations as shown in FIG. 12. The step pattern 24 is arranged on one side of the IDT 1 by using the solid electrode. With the above-mentioned configuration, it is possible to remove the undesired mode generated between the shield electrode 2 and the HOT-side electrode 3b of the IDT 3. It is further possible to remove the undesired mode generated between the shield electrode 2 and the IDT 1. Thus, the degree of suppression in the stopband can be improved.

FIG. 17 shows a SAW device in accordance with a twelfth embodiment. The shield electrode 2 and the IDT 1 have the same configurations as shown in FIG. 7. The steps 6 and 8 are arranged on the IDT 3 by using the solid electrodes. The step pattern 6 meets the same requirements as the step pattern 6 in FIG. 7. With the above-mentioned configuration, it is possible to remove the undesired mode generated between the shield electrode 2 and the HOT-side electrode 3b of the IDT 3. The degree of suppression in the stopband can be improved.

FIG. 18 shows a SAW device in accordance with a thirteenth embodiment. The IDT 1 and the shield electrode 2 have the same configurations as shown in FIG. 8. The step pattern 6 is arranged in the IDT 3 by using the solid electrode. The step pattern 6 meets the same requirements as the step pattern 6 in FIG. 8. With the above-mentioned configuration, it is possible to remove the undesired mode generated between the shield electrode 2 and the HOT-side electrode 3b of the IDT 3. The degree of suppression in the stopband can be improved.

Figure 19:
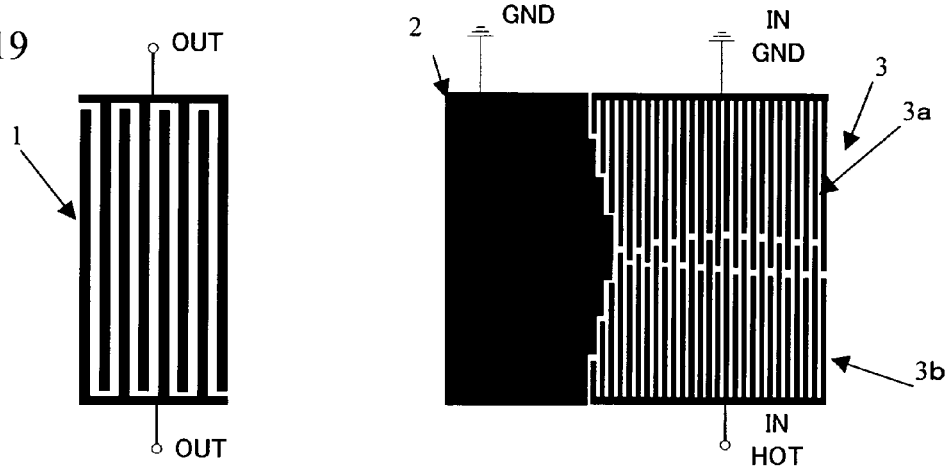
FIG. 19 shows a SAW device in accordance with a fourteenth embodiment.

FIG. 19 shows a SAW device in accordance with a fourteenth embodiment. The IDT 1, the IDT 3, and the shield electrode 2 have the same configurations as FIG. 7. However, the shield electrode 2 and the IDT 3 are closely arranged, as shown in FIG. 19. In this case, the distances between the edges of the shield electrode 2 and the edges of the IDT 3 are required to meet $m\lambda + \lambda/n$ where $\lambda$ is the wavelength in the passband of the SAW, m is 0 or a natural number, and n is a natural number. With the above-mentioned configuration, it is possible to remove the undesired mode generated between the shield electrode 2 and the HOT-side electrode 3b of the IDT 3. The degree of suppression in the stopband can be improved.

Figure 20:
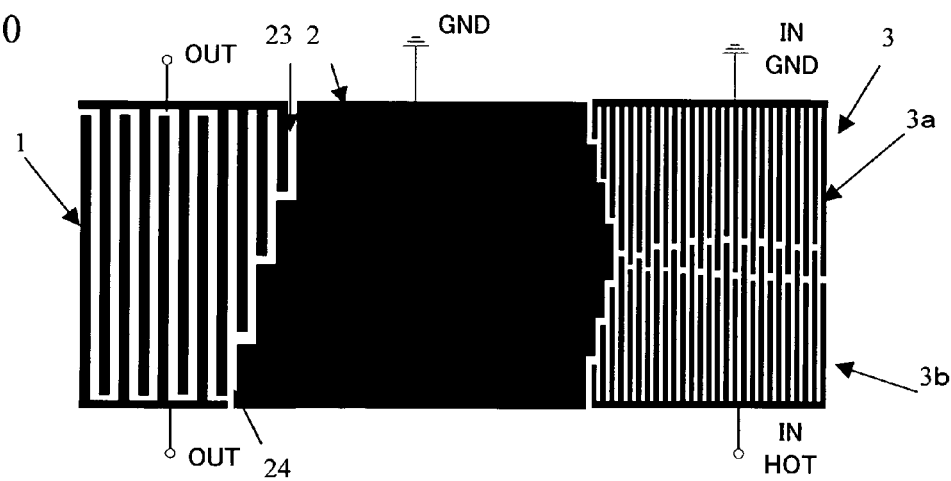
FIG. 20 shows a SAW device in accordance with a fifteenth embodiment.

FIG. 20 shows a SAW device in accordance with a fifteenth embodiment. In addition to the configurations of FIG. 19, the step patterns 23 and 24 are arranged on the IDT 1 and one side of the shield electrode 2 adjacent to the IDT 1, and the IDT 1 and the shield electrode 2 are closely arranged. With the above-mentioned configuration, it is possible to remove the undesired mode generated between the shield electrode 2 and the HOT-side electrode 3b of the IDT 3 facing the shield electrode 2. It is further possible to remove the undesired mode generated between the shield electrode 2 and the IDT 1. Thus, the degree of suppression in the stopband can be improved.

Figure 21:
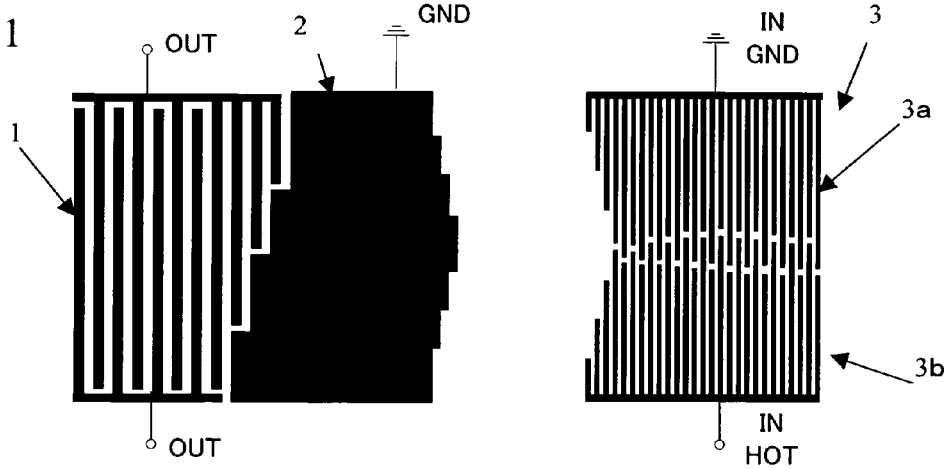
FIG. 21 shows a SAW device in accordance with a sixteenth embodiment.

FIG. 21 shows a SAW device in accordance with a sixteenth embodiment. In contrast to the configuration of FIG. 20, the IDT3 and the shield electrode 3 are separated. In this case, the distances between the edges of the shield electrode 2 and the edges of the IDT 3 are required to meet $m\lambda+\lambda/n$ where $\lambda$ is the wavelength in the passband of the SAW, m is 0 or a natural number, and n is a natural number. With the above-mentioned configuration, it is possible to remove the undesired mode generated between the shield electrode 2 and the HOT-side electrode 3b of the IDT 3. It is further possible to remove the undesired mode generated between the shield electrode 2 and the IDT 1. Thus, the degree of suppression in the stopband can be improved.

Figure 22:
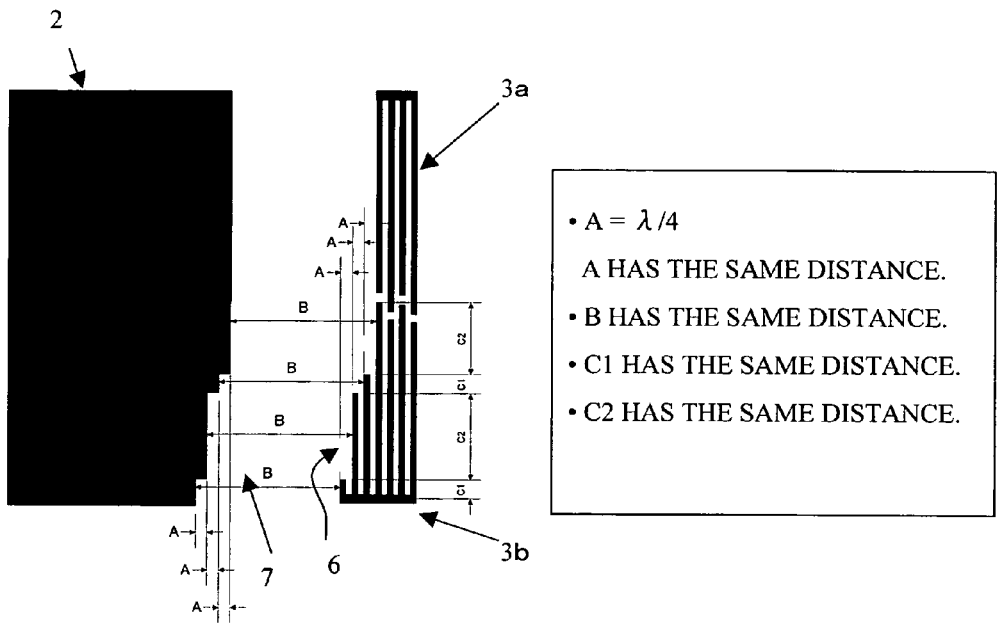
FIG. 22 shows a SAW device in accordance with a seventeenth embodiment.

FIG. 22 shows a substantial part of a SAW device in accordance with a seventeenth embodiment. In the above-mentioned embodiments, the steps have the equal length in the direction perpendicular to the propagation direction. In contrast, the seventeenth embodiment has steps having different lengths. Referring to FIG. 22, the step pattern 6 is arranged on the HOT-side electrode 3b of the IDT 3. The step pattern 6 includes steps having a length of C1 length and steps having a length of C2. In FIG. 22, C2 is longer than C1. The two steps having the length C1 have a phase difference of 180 degrees. The two steps having the length C2 have a phase difference of 180 degrees. Similarly, the shield electrode 2 includes steps having the length C1 and steps having length C2. The steps of the step pattern 6 are evenly spaced apart from those of the step pattern 7 so that the distance B is defined between the corresponding steps. The width of the steps of the step patterns 6 and 7 is equal to $\lambda/4$. It is thus possible to cancel the undesired waves generated between the steps C1 of the patterns 6 and 7. Similarly, the undesired waves generated between the steps C2 are cancelled.

Figure 23:
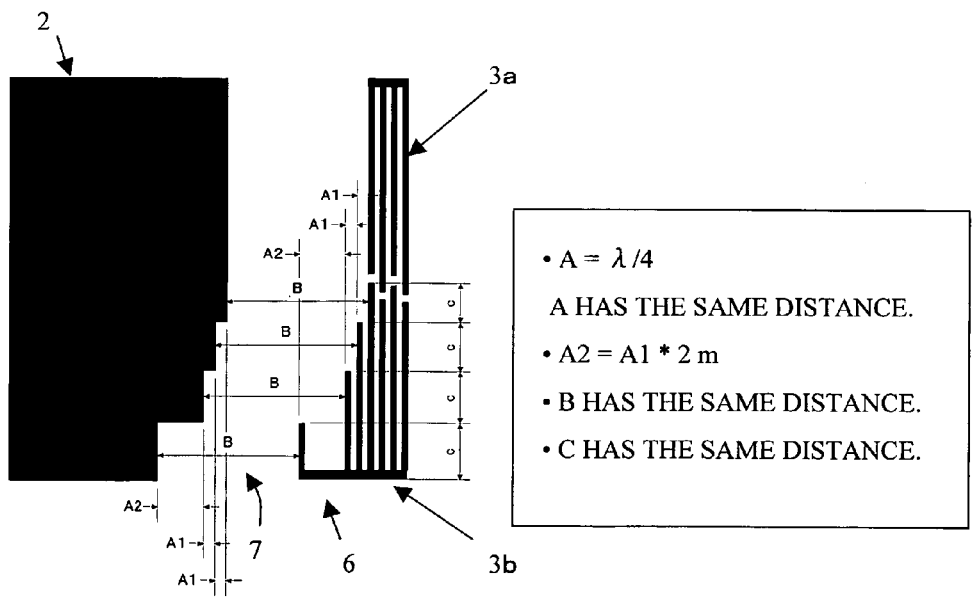
FIG. 23 shows a SAW device in accordance with an eighteenth embodiment.

FIG. 23 shows a substantial part of a SAW device in accordance with an eighteenth embodiment. The above-mentioned embodiments employ the identical width A of steps. In contrast, the eighteenth embodiment has steps having different widths. The step pattern 6 is arranged on the HOT-side electrode 3b of the IDT 3. The step pattern 6 has two different gaps A1 and A2 between the adjacent electrode fingers in which $A1=\lambda/4$ and $A2=A1*m$. A2 is equal to an integer multiple of A1. Therefore, the undesired waves can be cancelled. The shield electrode 2 has two step widths A1 and A2 so as to match the step pattern 6. The steps of the step pattern 6 are evenly spaced apart from those of the step pattern 7. In the above-mentioned configuration, the undesired waves are cancelled due to the phase difference of 180 degrees.

Figure 24:
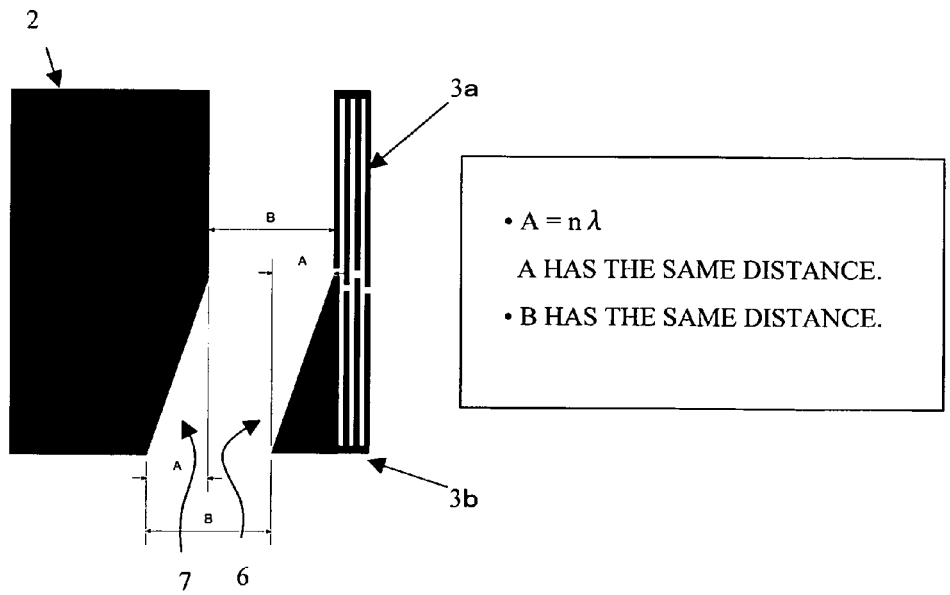
FIG. 24 shows a SAW device in accordance with a nineteenth embodiment.

FIG. 24 shows a substantial part of a SAW device in accordance with a nineteenth embodiment, in which the pattern 6 arranged on the HOT-side electrode 3b of the IDT 3 has a continuous taper. The tapered edge is a slant straight plane. The pattern 6 includes a pattern width A, which is equal to $n\lambda$ where n is a natural number. A is defined as a slant length of the taper in the propagation direction of the SAW. A pattern 7, which is a counterpart of the pattern 6, is arranged on the shield electrode 2 having a continuous taper. The pattern 7 includes the same pattern width A. The gap B between the patterns 6 and 7 is the same as the gap B between the ground-side electrode 3a and the shield electrode 2. With the above-mentioned configuration, it is possible to remove the undesired mode generated between the shield electrode 2 and the HOT-side electrode 3b of the IDT 3. The degree of suppression in the stopband can be improved.

Figure 25:
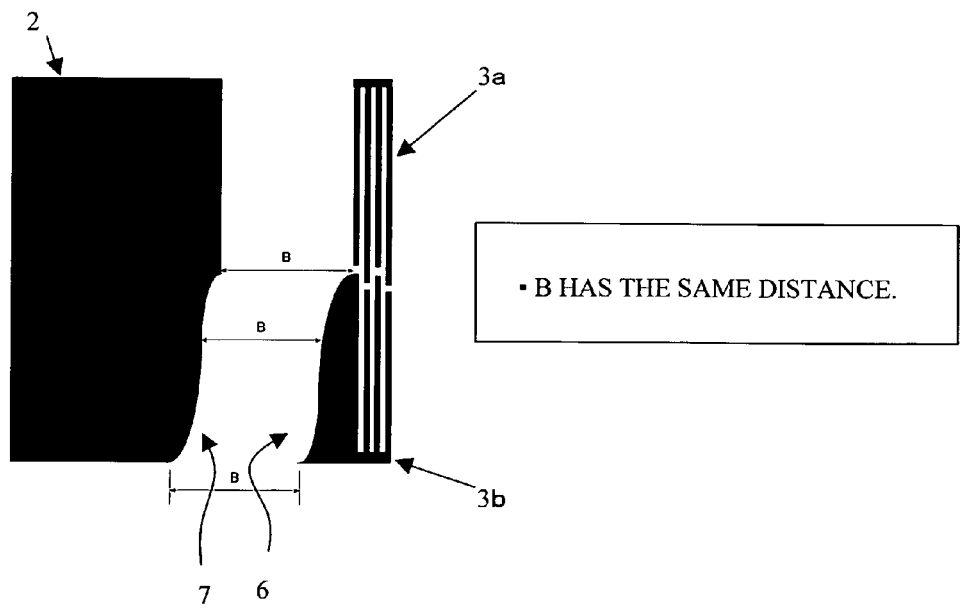
FIG. 25 shows a SAW device in accordance with a twentieth embodiment.

FIG. 25 shows a substantial part of a SAW device in accordance with a twentieth embodiment. The twentieth embodiment has a curved taper, which is used instead of the linear taper in FIG. 24. The distance between the HOT-side electrode 3b of the IDT 3 and the shield electrode 2 is the same at any point. With the above-mentioned configuration, it is possible to remove the undesired mode generated between the shield electrode 2 and the HOT-side electrode 3b of the IDT 3 facing the shield electrode 2. The degree of suppression in the stopband can be improved.

The present invention is not limited to the specifically disclosed embodiments, and other embodiments, variations and modifications may be made without departing from the scope of the present invention.

The present invention is based on Japanese Patent Application No. 2003-343856 filed on Oct. 1, 2003, the entire disclosure of which is hereby incorporated by reference.

What is claimed is:

1. A surface acoustic wave device comprising:
   a piezoelectric substrate;
   two interdigital transducers (IDTs) provided on the piezoelectric substrate; and
   a shield electrode provided on the piezoelectric substrate and set at a given potential, the shield electrode being interposed between the two IDTs,
   wherein:
   one of the two IDTs has a first pattern on an edge that faces the shield electrode;
   the shield electrode has a second pattern on an edge so as to be evenly spaced apart from the first; and
   the first pattern and the second pattern respectively include a plurality of steps, and distances between corresponding steps of the first pattern and the second pattern are all the same.

2. The surface acoustic wave device as claimed in claim 1, wherein the first pattern has steps and is a mountain-like shape or valley-like shape that has a peak or a bottom located between a center and an edge of the one of the two IDTs.

3. The surface acoustic wave device as claimed in claim 1, wherein the first pattern includes a step width equal to $m\lambda+\lambda/n$ where m is 0 or a natural number, n is a natural number, and $\lambda$ is a wavelength of a surface acoustic wave in a passband.

4. The surface acoustic wave device as claimed in claim 1, wherein a distance between the edge of the shield electrode and the edge of the IDTs is equal to $m\lambda+\lambda/n$ where m is 0 or a natural number, n is a natural number, and $\lambda$ is a wavelength of a surface acoustic wave in a passband.

5. The surface acoustic wave device as claimed in claim 1, wherein the first pattern is provided on one of a pair of comb-like electrodes to which an alternating current is applied.

6. The surface acoustic wave device as claimed in claim 1, wherein the first pattern is provided on both of a pair of comb-like electrodes.

7. The surface acoustic wave device as claimed in claim 1, wherein the first pattern and the second pattern respectively include steps, and the steps of the first and second patterns that face each other have identical lengths.

8. The surface acoustic wave device as claimed in claim 1, wherein the shield electrode has a third pattern on another edge opposite to the edge on which the second pattern is provided.

9. The surface acoustic wave device as claimed in claim 1, wherein:
the shield electrode has a third pattern on another edge opposite to the edge on which the second pattern is provided;
the surface acoustic wave device further comprises another IDT facing the third pattern; and
said another IDT includes a fourth pattern provided on an edge facing the third pattern.

10. The surface acoustic wave device as claimed in claim 9, wherein the third pattern and the fourth pattern are arranged with a constant ratio of the shield electrode to a surface area of the piezoelectric substrate between the IDTs and said another IDT.

11. The surface acoustic wave device as claimed in claim 1, wherein the first pattern and the second pattern respectively include steps that have comb-like electrodes.

12. The surface acoustic wave device as claimed in claim 1, wherein the first pattern and the second pattern respectively include steps that have solid electrodes.

13. The surface acoustic wave device as claimed in claim 7, wherein the third pattern includes a step that has at least one of a comb-like electrode and a solid electrode.

14. The surface acoustic wave device as claimed in claim 1, wherein the first pattern and the second pattern are respectively arranged with continuous linear tapers.

15. The surface acoustic wave device as claimed in claim 1, wherein the first pattern and the second pattern are respectively arranged with continuous curved tapers.

16. The surface acoustic wave device as claimed in claim 14 wherein a tilted length of the tapers equals to $n\lambda$ in a propagation direction of a surface acoustic wave where n is a natural number.

17. A surface acoustic wave device comprising:
a piezoelectric substrate;
at least one interdigital transducer (IDT) provided on the piezoelectric substrate; and
a shield electrode provided on the piezoelectric substrate and set at a given potential,
wherein:
the IDT has a first pattern on an edge that faces the shield electrode; and
the shield electrode has a second pattern on an edge so as to be evenly spaced apart from the first pattern,
wherein the first pattern has steps arranged at different intervals so that vector intensities of undesired excitations generated between the shield electrode and the edge of the IDT are zero in total.

* * * * *